United States Patent [19]

Berger et al.

[11] Patent Number: 4,906,855
[45] Date of Patent: Mar. 6, 1990

[54] PHOTOSENSITIVE MATRIX WITH TWO DIODES PER DOT WITHOUT SPECIFIC RESETTING CONDUCTOR

[75] Inventors: Jean-Luc Berger; Marc Arques, both of Grenoble, France

[73] Assignee: Thomson-CSF, Paris, France

[21] Appl. No.: 313,451

[22] Filed: Feb. 22, 1989

[30] Foreign Application Priority Data

Feb. 26, 1988 [FR] France ................................ 88 02360

[51] Int. Cl.⁴ ........................ H01J 40/14; H04N 3/14
[52] U.S. Cl. ........................... 358/213.23; 358/213.23
[58] Field of Search ............................ 250/578, 211 J; 358/213.23, 213.25, 213.26; 357/304, 24

[56] References Cited

U.S. PATENT DOCUMENTS 4,703,169 10/1987 Arita ..................................... 250/578
4,758,734 7/1988 Uchida et al. ........................ 250/578

Primary Examiner—David C. Nelms
Assistant Examiner—William Oen
Attorney, Agent, or Firm—Oblon, Spivak, McClelland, Maier & Neustadt

[57] ABSTRACT

The disclosure concerns matrices of photosensitive elements. To prevent the need for a resetting light source in matrices using, as a photosensitive dot, a photodiode in series with a capacitor between a row conductor and a column conductor, a photosensitive dot is proposed, formed by a photodiode in series with a reading diode between a row conductor and a column conductor, it being possible to put the reading diode into forward or reverse conduction. To read the photoelectrical charges generated, a reading pulse, which makes the reading diode forward conductive, is applied. To then reset the potential of the floating node A, at which the photoelectrical charges accumulate, at a constant starting level, a reverse resetting pulse is applied, thus making the reading diode conductive (but this time in reverse conduction).

10 Claims, 4 Drawing Sheets

PHOTOSENSITIVE MATRIX WITH TWO DIODES PER DOT WITHOUT SPECIFIC RESETTING CONDUCTOR

BACKGROUND OF THE INVENTION

1. Field of the Invention

The invention concerns matrices of photosensitive elements.

The standard way to make matrices of photosensitive elements is to provide for a network of conductors in rows and a network of conductors in columns, with a respective photosensitive element at each intersection of a row and a column. Through the network of rows, there is selected a row of photosensitive elements for which it is desired to know the electrical output signals. Through the network of column conductors, a respective output signal is read for each of the elements of the selected row.

2. Description of the Prior Art

The French patent application No. 86 00716 describes a photosensitive matrix, having a network of photosensitive dots, wherein each photosensitive dot has a charge storage capacitor in series with a photosensitive element, this unit being connected between a row conductor and a column conductor. The photosensitive element may be an PIN photodiode with three layers (a P type semiconducting layer, an intrinsic layer I and an N type layer).

Charges are generated in the photodiode by the illumination of the photosensitive dot. These charges get accumulated at the (floating) node between the photodiode and the capacitor. They are read by the application, to the row conductor, of a voltage pulse in one direction which gives the photodiode a forward bias (whereas it was reverse biased during the accumulation stage). Charges, in a quantity corresponding to the accumulated charges, are then transferred from the floating node to the column (or conversely from the column to the floating node). The reading operation consists in measuring this movement of charges.

After the end of the reading pulse, the photodiode goes off for a new stage of illumination and integration of charges.

But the potential of the floating node is no longer at the value that it had at the start of the integration stage. It is therefore not possible to begin a new integration stage without setting up this floating node potential at a well-determined starting value.

The reading stage is therefore followed by a stage for resetting the potential of the floating node.

The resetting is done by illumination of the photodiode. It is therefore necessary to provide for a source of illumination and for control means synchronized with the photosensitive matrice reading means, in order to perform a resetting operation after each reading stage.

Because of this, the acquisition of a measuring signal has to be done discontinuously, as follows: illumination, then reading, then resetting flash, then another illumination etc.

The present invention proposes a new photosensitive dot structure which removes the need for a source of resetting illumination and enables the acquisition of information in a continuous flow, without its being necessary to illuminate the matrix in a discontinuous way.

SUMMARY OF THE INVENTION

According to the invention, there is proposed a matrix of photosensitive dots comprising a network of photosensitive dots arranged in rows (at least one row) and columns (at least one column), each photosensitive dot being located at the intersection of a row and a column, wherein each photosensitive dot comprises a photosensitive element in series with a reading diode between a row conductor and a column conductor, the reading diode having a first forward turn-on voltage threshold and a second reverse turn-on voltage threshold, the matrix further comprising, for the reading of the charges that have collected at the junction point of the photosensitive element and the reading diode, a means to apply the following to the row conductor:
- firstly, a steady reference voltage level to the row conductor during a charge integration stage;
- then a voltage pulse, with a first sign, called a reading pulse;
- finally, a voltage pulse, of the opposite sign, called the resetting pulse, the amplitude of the difference between the voltage levels of the reading pulse and the resetting pulse being greater, in absolute value, than the difference between the forward turn-on voltage and reverse turn-on voltage thresholds for the reading diode.

The photosensitive element may be a photodiode or a photoconductor.

The reading diode is designed to have a far lower capacitance than the photosensitive element. For this reason, it will generally have an area which is far smaller than the area of the photosensitive element.

The amplitude of the resetting pulse is chosen in such a way that the potential of the common node, connecting the photosensitive element to the reading diode, always returns to the same value after a resetting pulse, and this is why a relationship is imposed between the pulse amplitude and the difference between the forward and reverse turn-on voltage thresholds of the reading diode. Preferably, the amplitude of the difference between the steady reference voltage level and the resetting pulse voltage level is very close to the difference between the forward and reverse turn-on voltage thresholds of the reading diode.

The reading diode will have a voltage/current characteristic curve resembling that of a zener diode, with a reverse turn-on voltage threshold that is relatively low in terms of absolute value (between $-8$ and $-10$ volts for example) and a forward turn-on voltage threshold of about $\pm 1$ volt.

The reading diode is herein called a "diode" because it has a current/voltage characteristic curve which is similar to that of a diode, but it can be made in the form of a structure which is not necessarily that of a PN diode as understood usually. In particular, the reading diode may advantageously be made in the form of an open base transistor of the NIPIN type, namely a structure with two electrodes and five superimposed, semiconductor layers, which are respectively an N type doped layer, a relatively thick intrinsic layer, a very thin P type layer, a very thin intrinsic layer and, finally, an N type doped layer. A PINIP transistor (where all the types of conductivity are reversed with respect to the NIPIN transistor) may also be used.

With this type of reading diode, a fairly reproducible value is obtained for the forward and reverse turn-on threshold voltages, which is desirable. These voltages have, moreover, values which are quite compatible with the pulse values that can be applied to the row conductors by means of control circuits with MOS transistors.

It will be seen, in the following detailed description, that there are two different possibilities of operation, depending on whether the steady reference voltage of the row conductor is greater than or smaller than the reverse turn-on threshold voltage of the reading diode. In one of these possibilities, the advantage obtained is that the quantity of charges read is always greater than a given threshold, even for a maximum illumination corresponding to the saturation of the photosensitive dot, and this makes it easier to read the charges. A greater range of measurement of charges, between a minimum illumination and a saturation illumination, is also obtained. In the other case, the voltage excursion is smaller, but the advantage obtained is that, in the event of saturation, the excess charges, generated by excessively high illumination, are removed towards a row conductor and not a column conductor. The excess charges, coming from the dots of a row which are not being read, thus do not come and disturb, at one column, the charges which are being read and which come from the other row of dots.

The invention can be applied to all sorts of photsensitive matrices, including those which are used in radiology and which, therefore, comprise a scintillator (gadolinium oxide, cesium iodide etc.) to convert X-radiation (or gamma, neutronic or other radiation) into light radiation in the band of wavelengths to which the photodiodes are sensitive.

The invention is particularly suited to an embodiment wherein the photosensitive dots are made by the superimposition of amorphous silicon layers.

Among the advantages anticipated from the present invention (for these advantages are essential to the quality of the matrices made), we might mention:

The simplicity of the structure in which each photosensitive dot comprises only two elements;

the low capacitance of the columns of photosensitive dots;

the high reading speed;

efficient uncoupling between the photosensitive dots of neighbouring rows or columns;

the reduction in stray noise when the reading is done; this stray noise could be generated in prior art systems through the fact that the photosensitive diode is made forward conductive; here the photodiode remains, in principle, always reverse biased, even during the reading.

BRIEF DESCRIPTION OF THE DRAWINGS

Other features and advantages of the invention will emerge from the following detailed description, made with reference to the appended drawings, wherein.

DESCRIPTION OF PREFERRED EMBODIMENTS

Figure 1:
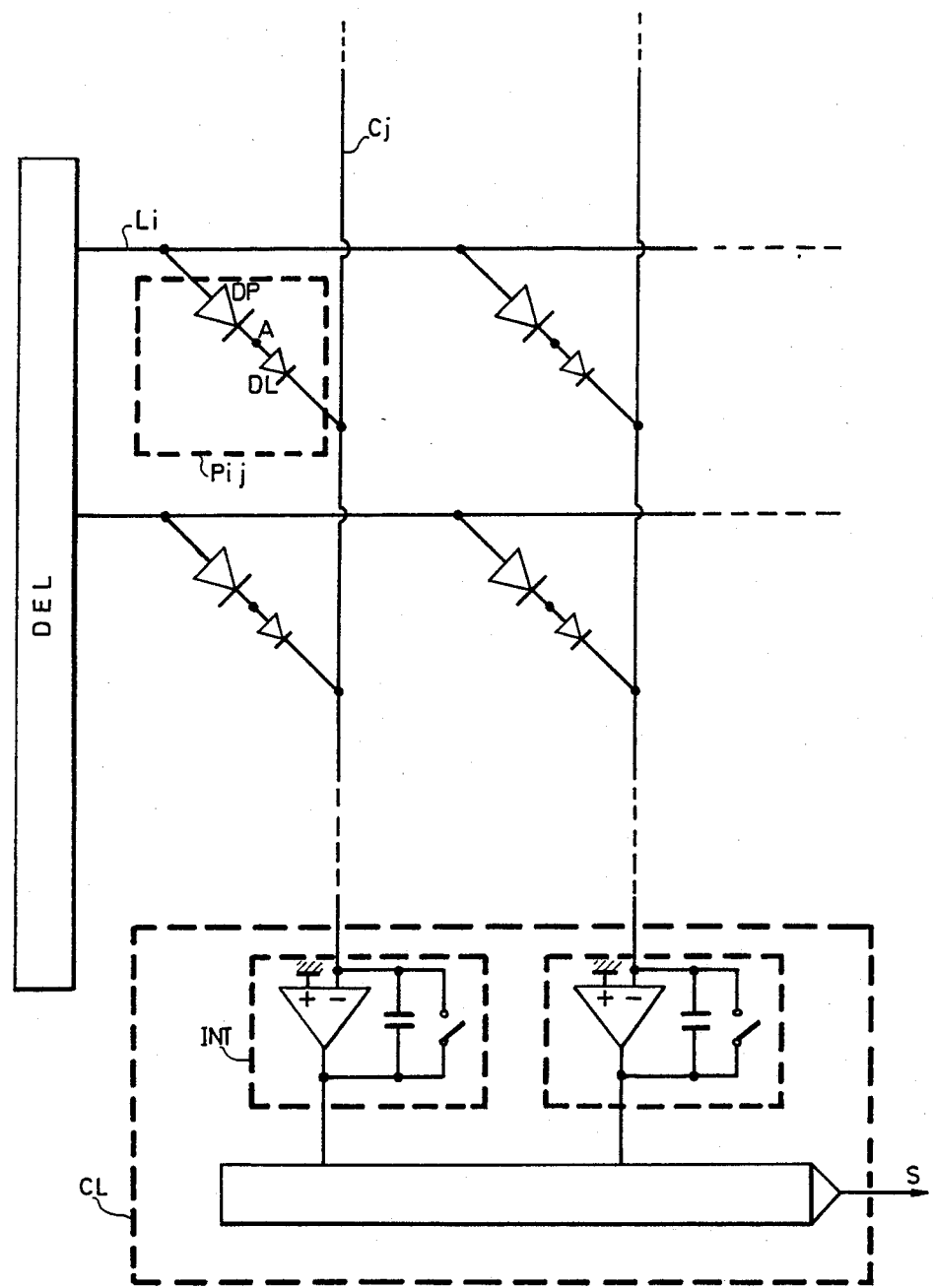
FIG. 1 shows a matrix of photosensitive dots according to the invention.

FIG. 1 shows a simplified diagram of a matrix of photosensitive dots according to the present invention.

The matrix comprises a network of rows and columns of photosensitive dots Pij.

Each row comprises a row conductor Li, to which the photosensitive dots of this row are connected. The row conductor Li is used to give a steady reference voltage Vp during an integration stage, and then a reading pulse during a reading stage and, finally, a resetting pulse before a new stage of integration. The row conductors are connected to a row decoder DEL, capable of selecting a determined row for which it is sought to read the dots, and of giving the reading and resetting pulses on this selected row, while the other rows are kept at the steady reference voltage Vp.

Each column has a column conductor Cj to which the photosensitive dots of this column are connected. The column conductor Cj is connected to a circuit CL for reading the charges generated by the photosensitive dot Pij located at the intersection between this column and the selected row.

In one embodiment, the reading circuit comprises an integrator INT for each of the columns of dots, and a multiplexer MUX receiving the outputs of the integrators to give, successively, at its output S, signals representing the illumination of the successive dots of the row.

In other cases, the reading circuit could be a charge transfer circuit, and the multiplexer could be a charge transfer shift register.

According to the invention, each photosensitive dot Pij has a photosensitive element Tp which, in principle, is a photodiode but may be something else, for example a photoconductor. This element is series-connected with a reading diode DL, and the set is connected between a row Li and a column Cj. In the following description, the photosensitive element shall be taken to be a photodiode DP.

The junction point A between the photosensitive element and the reading diode is the node where the electrical charges, generated by illumination in the photosensitive element, get accumulated.

The reading diode DL, which enables the transfer of charges from the floating node A to the column conductor Cj, has particular characteristics according to the invention.

First of all, it should have a low capacitance as compared with that of the photodiode. This enables the overall capacitance, seen from a column, to be appreciably smaller than the sum of the capacitances of the photodiodes connected to this column.

Then, according to the invention, it is provided that the reading node can be made conductive with forward bias if the voltage at its terminals becomes greater than a first voltage threshold Vsd, and that it can be made conductive with reverse bias if the voltage at its terminals becomes smaller than a second voltage threshold Vsi.

Figure 2:
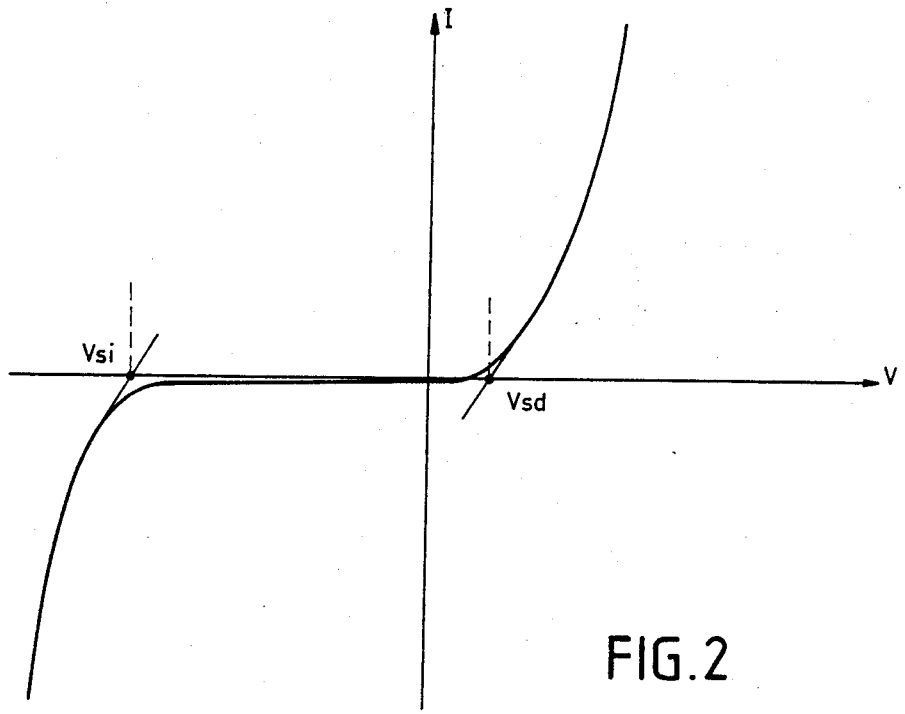
FIG. 2 shows a voltage/current curve of a diode for reading a matrix according to the invention.

In other words, the reading diode has a characteristic curve of the type shown in FIG. 2, similar to that of a zener diode.

The threshold voltages should be compatible with the operation of the control circuits of the matrix. If the matrix has to work with MOS transistors for example, it is desirable that the turn-on threshold should not exceed 12 to 15 volts in terms of absolute value.

However, on the other hand, the difference between the first threshold and the second threshold should be high enough because it is this difference that will limit the dynamic range of the illumination measuring signal.

For example, there are known ways to make diodes which are made conductive with forward bias for a first positive voltage of about +1 volt, and which are made conductive with reverse bias for a second adjustable negative voltage of between about −8 volts and −15 volts, through an appropriate choice of semiconductor layers dopings.

Since it extremely desirable for these thresholds to be stable and reproducible, it will be chosen to make the reading diode DL according to a technology that enables this stability and this reproducibility to be obtained. It has been observed that a diode for which reverse conduction is achieved by putting a junction in avalanche state, does not provide all the desired guarantees of stability and reproducibility. However, an open base NIPIN type transistor, for which reverse conduction is achieved by lowering a potential barrier, may act as a reading diode having far better characteristics from this viewpoint.

Figure 3:
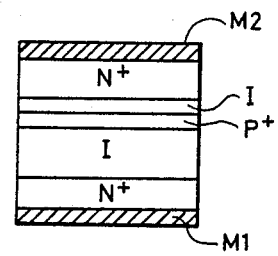
FIG. 3 gives a schematic view of a reading diode consisting of a structure with five layers between two electrodes.

A NIPIN transistor is a structure with five superimposed semiconductor layers between two electrodes M1 and M2, as shown schematically in FIG. 3: this structure can be easily made of amorphous silicon, by successive deposition of a layer of N type silicon, a layer of relatively thick intrinsic silicon, a very thin P type layer, a very thin intrinsic layer and an N type layer. That side of the transistor which is connected to the column conductor is the collector (on the thickest intrinsic layer side) if the photodiode DP has its cathode connected to the point A. If not, the other side is the collector.

The photodiode may be an PIN diode. It may also be an open base NIPIN type transistor. It could even be replaced by a simple photoconductor such as an intrinsic layer of amorphous silicon.

The photodiode DP has a relatively large area for it to have sufficient sensitivity. The reading diode DL is smaller, and is preferably placed in darkness, for example, by means of a metallic layer which covers it.

We shall now describe the working of the matrix of FIG. 1, firstly in a case where the steady reference voltage Vp, applied to the row conductor during the accumulation of photoelectrical charges, is greater than the threshold Vsi for making the reading diode conductive in reverse bias, and then in a case where the steady reference voltage is below this threshold, and it will be shown how the choice of the potentials applied to the row conductors should be related to the forward turn-on threshold (Vsd) and reverse turn-on threshold (Vsi) of the reading diode or of the structure that takes its place.

I. A CASE WHERE Vp IS GREATER THAN Vsi

To simplify the explanations, it shall be assumed that the capacitance of the reading diode is negligible as compared with that of the photosensitive diode DP. If this were not the case, the digital values of potentials and potential variations indicated during the explanations would be modified, but the operating principle would remain valid.

It shall also be assumed that the reading circuit connected to the columns keep their potential at a null reference value.

Figure 4A:
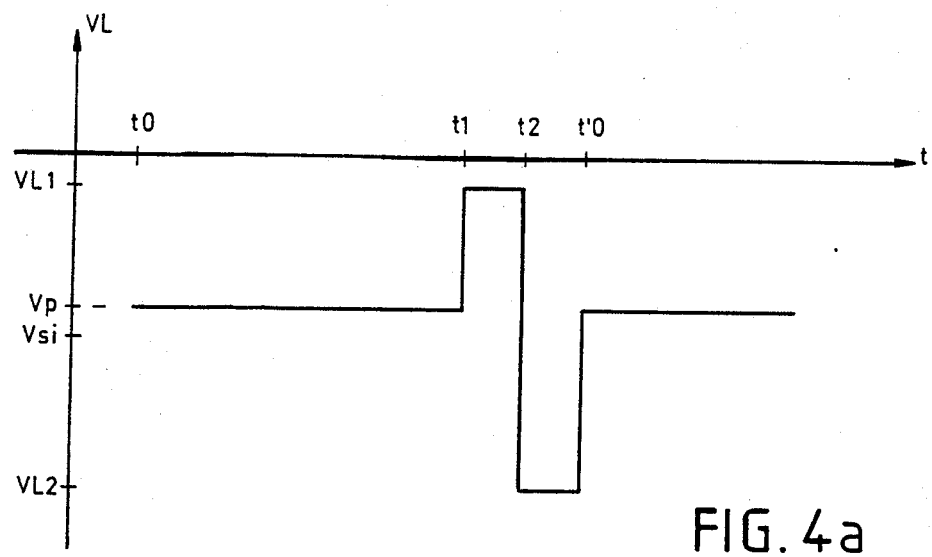
FIG. 4 shows the timing diagram of the potentials of the row conductor Li and the node A of the matrix of FIG. 1, in a first mode of operation of this matrix.
Figure 4B:
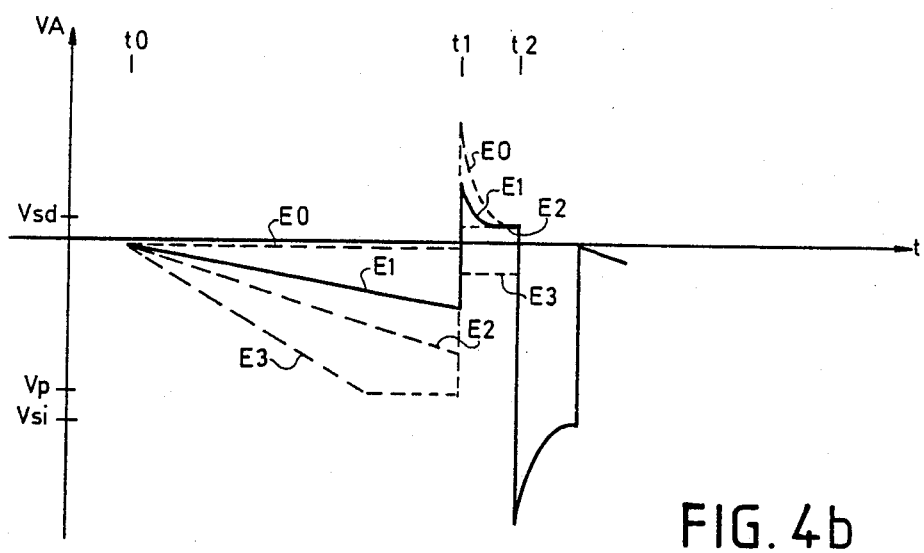

FIG. 4 shows timing diagrams which can be used to illustrate the operation. The variations in the potential VL, applied to the row conductor Li, are shown in the diagram 4a. The variations in the potential VA of the node A are shown in the diagram 4b.

The periodic working cycle lasts between an instant t0 and an instant t'0.

At the outset, just after the instant t0, i.e. just after the potential of the row conductor of a selected row has been brought to its steady reference value Vp, the initial state is as follows:

the potential VL on the row conductor Li has a steady reference value Vp, for example, −5 volts. The value is chosen in such a way that the photodiode remains reverse biased even when the potential of the node A falls owing to the arrival of further charges;

the potential VA at the node A has a value which is null or close to zero.

The potential of the column conductor Cj is assumed to be null.

It will be seen that it is really the situation that will exist at the end of the reading cycle that shall now be described.

At the instant t0, there starts a charge integration stage which will last up to the time t1.

The illumination generates charges which collect at the node A under the effect of the electrical field in the reverse biased photodiode DP. With the potential directions chosen, in view of the direction in which the photodiode is connected, the charges that accumulate are electrons.

The potential of the node A falls as and when the charges arrive, hence with a descending slope which is proportionate to the intensity of illumination.

The graph 4b shows four different cases:
null or almost null illumination E0;
medium illumination E1;
maximum measurable illumination E2;
high illumination generating an effect by which excess charges are shed into the row conductor, thus achieving an anti-dazzle effect.

At the instant t1, the integration period ends, and a reading pulse is applied to the selected row conductor, making its potential go from a steady reference value Vp to a value Vl1.

The value Vl1 is chosen to be negative so as not to make the photodiode forward conductive, but to be close enough to zero so that the illumination measuring range is sufficiently wide. This range is, in effect, related to the difference in potential between VL1 and Vp, and this difference should be enough.

In the example chosen, Vl1 has been taken to be equal to −1 volt.

By capacitive coupling, the sudden increase in voltage at the row conductor gets transmitted to the node A. The photodiode DP is, in effect, reverse biased and, since its capacitance is far higher than that of the reading diode, the essential part of the amplitude of the rising edge of the reading pulse is found again at the node A.

The potential of the node A, which had a value which was all the lower as the illumination had been high during the integration stage, increases suddenly by a value (VL1−Vp).

The four cases of illumination shown in FIG. 4 cause the following effects:

minimum illumination E0: the potential of the node A goes practically from 0 to VL1−Vp. The reading diode becomes conductive and the potential of the node A is brought to the value Vsd (foward conduction threshold of the diode).

A quantity of charges is transmitted to the column conductor Cj to bring the potential of the node A to the value Vsd. It is this quantity of charges that is read by the reading circuit and represents the null illumination to which the photodiode was subjected during the integration stage t0, t1;

medium illumination E1: the potential of the node A was below zero and goes to above VSD at the instant t1. The reading diode becomes conductive and a quantity of charges is removed towards the column conductor. This quantity is smaller than in the previous case, because the potential of the node A is raised to a smaller extent. It again represents a measurement of illumination to which the photodiode was subjected from t0 to t1;

saturation illumination E2: the potential of the node A dropped to a value such that, when the amplitude reading pulse VL1-Vp is applied, this potential rises only to the value Vsd. The reading doode is practically not made conductive, or it goes off again, without transferring any charge. A null charge is read at the column conductor. This null charge represents a saturation illumination;

illumination beyond E2: the potential of the node A never rises sufficiently at the instant of the reading pulse to make the reading diode conductive; a null charge is still read;

illumination E3: the potential of the node A cannot fall, during the integration stage, to below the potential Vp; if photoelectrical charges continue to be generated, while the potential of the node A has already reached the value Vp, they are removed through the photodiode towards the row conductor. Furthermore, as in the previous case, the charge read at the column during the reading pulse is null.

Thus, we arrive at a charge transfer to the column which is all the smaller as the illumination is greater. This can be advantageous for the reading of low level illumination. Furthermore, there is a saturation effect and an anti-dazzle effect by removal of excess charges. The saturation threshold, besides, is not the same as the anti-dazzle threshold.

The period for which the reading pulse lasts is long enough for all the charges, present at the node A, to get removed. This reading pulse ends at the instant t2.

At the instant t2, the resetting pulse is applied. However, there could be provision for a time interval between the end of the reading pulse and the start of the resetting pulse, the potential V1 of the row conductor returning temporarily to its steady reference value during this interval.

The resetting pulse makes the potential VL of the row conductor go to a value VL2 such that the potential of the node A falls, by capacitive coupling, to a value below the threshold Vsi for making the reading diode reverse conductive.

Here again, since the diode has a far greater capacitance than the capacitance of the reading diode, the variation in potential VL2-VL1 is almost entirely retransmitted to the node A.

In the example shown, the potential is made to go from VL1=−1 volt to VL2=−11 volts.

It is indispensable for VL1-VL2 to be greater, than the difference Vsd-Vsi between the forward and reverse conduction thresholds of the diode, so that the potential of the node A goes to the value Vsd to a value smaller than Vsi.

The reading diode then becomes conductive (but in reverse bias) and the potential of the node A quickly returns to the value Vsi, at which the diode stops being conductive. The resetting pulse must last long enough to enable this return of the potential of the node A to the value Vsi.

The start of a new integration stage is defined by the end (at the instant t'0) of the resetting pulse. At this instant, the potential of the row conductor is brought back to its steady reference value Vp.

Precisely, the voltage difference VL2-Vp is preferably chosen to be equal to Vsi so that the potential of the node A, which increases through capacitive coupling by a value Vp-VL2 at the instant t'0, returns from the value Vsi to 0. The potential of the node A therefore returns to the starting value which had been envisaged at the beginning of the integration stage. The cycle is ended.

However, there could be provision for the voltage difference VL2-Vp to be chosen at an absolute value which is slightly smaller than the absolute value of Vsi. However, it would be preferable for the potential of the node A to rise as high as possible towards the threshold Vsd, in order to obtain the advantage of a maximum reading range. A case can also be envisaged where the voltage difference VL2-Vp is chosen, in absolute value, as being greater than the absolute value of the difference Vsd-Vsi. In this case, the reading diode goes back, at the instant T'0, into forward conduction, and the potential of the point A gradually returns to the value Vsd (and not zero) in removing the charges on the column. In this case, each integration stage starts again from a starting potential Vsd at the node A.

According to the invention, the potentials VL1, VL2, Vp are therefore chosen in such a way that;

firstly, VL1-VL2 is greater than Vsd-Vsi,
secondly, VL2-Vp is close to Vsi.

II. A CASE WHERE Vp IS SMALLER THAN Vsi

The operation is quite similar to that of the above case, with an integration stage (t0 to t1) followed by a reading pulse (t1 to t2), and then by a resetting pulse (t2 to t0).

The explanations are, on the whole, the same as those given above, and we shall now refer to FIG. 5 to see the differences in operation.

Figure 5A:
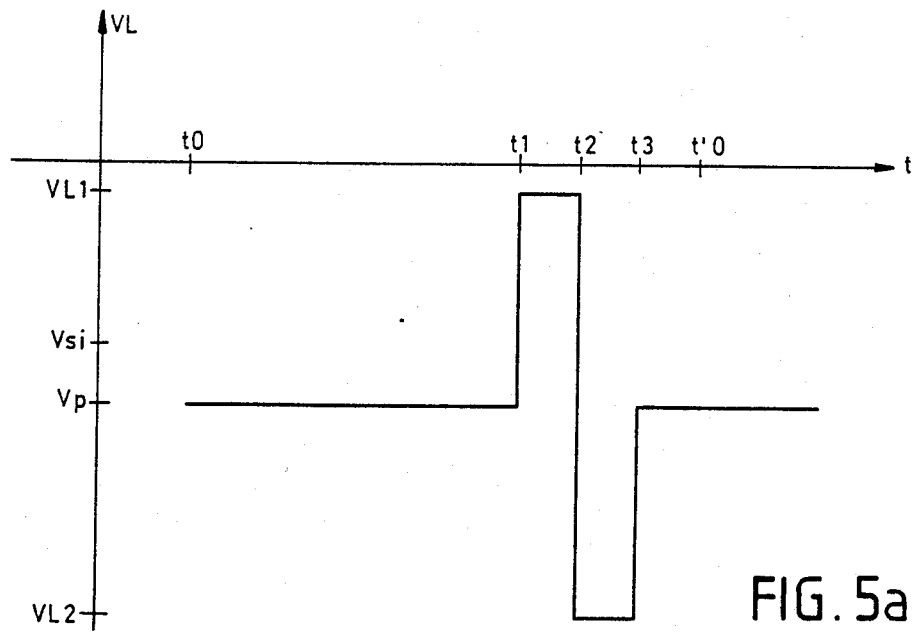
FIG. 5 shows a timing diagram of the potentials of the row conductor Li and the node A of the matrix of FIG. 1 in a second mode of operation of this matrix.
Figure 5B:
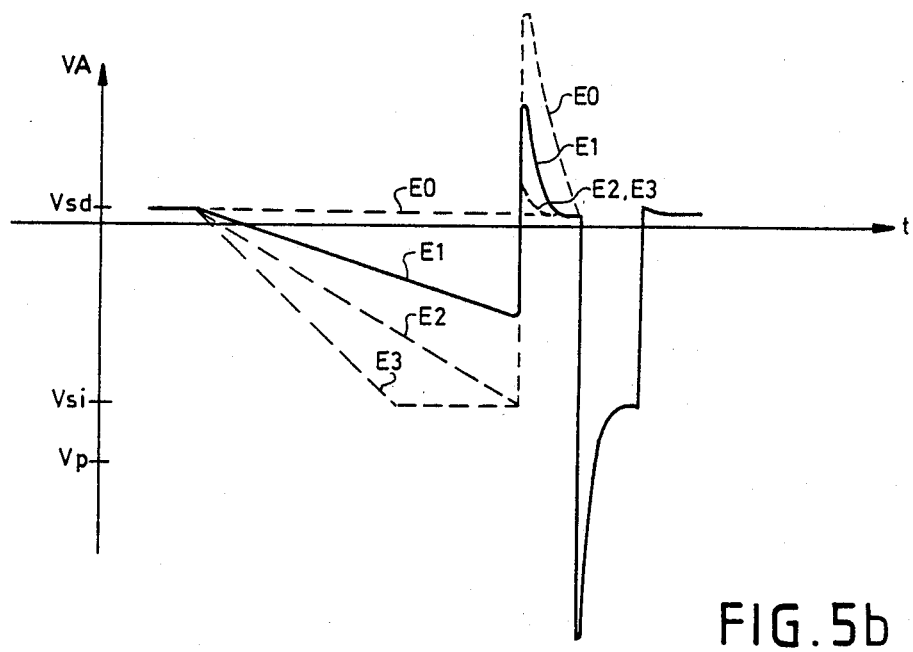

The timing diagram of FIG. 5a shows the potentials applied to the row conductor during the integration/reading/resetting cycle. The timing diagram of FIG. 5b shows the potential levels that result therefrom at the node A.

In the example shown, it is assumed that the starting point of the potential of the node A at the time t0 is equal to Vsd, the threshold for making the reading diode forward conductive. However, it could also be provided that the starting potential will be zero.

During the integration stage, the potential of the row conductor is Vp, for example −8 volts, and the potential of the node A falls from Vsd to a value which depends on the illumination. The curve of variation of the potential VA is represented for:
  null illumination E0,
  medium illumination E1 (in solid lines)
  saturation illumination E2,
  illumination E3 beyond the saturation threshold.

For the illumination E3 beyond the saturation threshold.

For the illumination E2 and beyond it, the potential of the node A reaches the value Vsi during the integration period But it cannot become more negative because, in that case, the reading diode tends to become conductive (in reverse bias) and prevents the charges from continuing to collect at the node A. There is saturation. The excess charges flow away to the columns Cj.

At the instant t1, a reading pulse is emitted. The potential of the row conductor of the row to be read goes from Vp to VL1. VL1 is slightly negative when the photodetector element is a photodiode, for this photodiode should remain reverse biased. For example, VL1 = −1 volt as in FIG. 4.

The potential of the node A rises suddenly by a value VL1-Vp. As it was between Vsi and Vsd, even for maximum illumination, it goes, in any case, to above Vsd, provided that VL1-Vp is greater than Vsd-Vsi. This is possible provided that VL1 is taken to be sufficiently close to Vsd. The difference in potential VL1-Vp may, however, be slightly smaller than Vsd-Vsi, in which case the saturation is more gradual around the illumination level E2.

The reading diode then becomes forward conductive, and removes a quantity of charges which depends on the value of the potential of the node A at the instant T1.

It will be observed that the quantity of charges is all the greater as the illumination has been lower: this facilitates the reading of low illumination levels. At the instant t2, namely after a period which is sufficient for the charges to get removed towards the column, a resetting pulse is applied to the row conductor. The potential VL is made to go from the value VL1 to a value VL2 which is far smaller than VL1, with the following criteria being used to choose VL2:
  the interval VL1-VL2 is greater than the interval Vsd-Vsi, in such a way that the potential of the node A falls below Vsi at the instant t2;
  and the interval Vp-VL2 is equal to or very close to Vsd-Vsi so that, at the instant t3 when the resetting pulse ends, the potential of the node A suddenly goes from the value Vsi to the value Vd or to a value very close to it.

Consequently, at the instant t2, the potential of the node A suddenly goes above Vsi, the reading diode becomes reverse conductive, and the potential of the node A returns to the value Vsi.

At the instant t3, the resetting pulse ends because the row conductor is reset at the potential Vp. The potential VA rises suddenly from the value Vsi to a value Vsi+(Vp-VL2), i.e. to a value which is equal to or very close to Vsd.

If the potential VA goes to Vsd, a new integration cycle can start immediately. If it goes slightly over, the reading diode becomes conductive and removes the charges at the column, and it must be taken that the new integration cycle will start only at the instant t'0, namely a short moment after the instant t3, so that the potential VA has the time to return to the value Vsd.

If the potential Va returns to slightly above Vsd because Vp-VL2 is slightly smaller than Vsd-Vsi, then it is the value to which the potential VA returns that defines new starting point of the integration. The system can work in all three cases.

The operation of the cycle for the integration of charges and for the reading of these charges has thus been completely described for one row of the matrix. The different rows each receive, successively, a reading pulse, followed by a resetting pulse, and these pulses are staggered in time, from one row to another other, so that no two rows are addressed simultaneously in read/resetting mode.

The integrators of the reading circuit CL should be short circuited outside the reading pulse (and particularly during the resetting pulses), so as to integrate no charges other than those that effectively correspond to a measurement of the illumination, i.e. the charges removed during the reading pulse. Consequently, it should be provided that the reading pulse for a row will be delayed not only with respect to the reading pulse for the previous row, but also with respect to the resetting pulse for the previous row. In the case of FIG. 5, for example, the best approach would be to wait for the instant t'0, to start the reading pulse for a following row.

What is claimed is:

1. A matrix of photorensitive dots comprising a network of photosensitive dots arranged in rows (at least one row) and columns (at least one column), each photosensitive dot being located at the intersection of a row and a column, wherein each photosensitive dot comprises a photosensitive element in series with a reading diode between a row conductor and a column conductor, the reading diode having a first forward turn-on voltage threshold (Vsd) and a second reverse turn-on voltage threshold (Vsi), the matrix further comprising, for the reading of the charges that have collected at the junction point of the photosensitive element and the reading diode, a means to apply the following to the row conductor:
  firstly, a steady raference voltage (Vp) level to the row conductor during a charge integration stage;
  then a voltage pulse, with a first sign, called a reading pulse;
  finally, a voltage pulse, of the opposite sign, called the resettnng pulse, the amplitude (VL1-VL2) of the difference between the voltage levels of the reading pulse and the resetting pulse being greater, in absolute value, than the difference between the forward turn-on voltage and reverse turn-on voltage thresholds for the reading diode.

2. A matrix according to claim 1, wherein the amplitude of the difference between the steady reference voltage level (Vp) and the voltage level of the resetting pulse (VL2) is close to the difference between the forward turn-on voltage threshold (Vsd) and the reverse turn-on voltage threshold (Vsi) of the reading diode.

3. A matrix according to claim 2, wherein the amplitude of the difference between the steady reference voltage level (Vp) and the resetting pulse voltage level (VL2) is substantially equal to the difference between the forward turn-on voltage threshold (Vsd) and the reverse turn-on voltage threshold (Vsi) of the reading diode.

4. A matrix according to claim 2, wherein the amplitude of the difference between the steady reference voltage level (Vp) and the resetting pulse voltage level (VL2) is slightly smaller than the difference between the forward turn-on voltage threshold (Vsd) and the reverse turn-on voltage threshold (Vsi) of the reading diode.

5. A matrix according to claim 2, wherein the amplitude of the difference between the steady reference voltage level (Vp) and the resetting pulse voltage level (VL2) is slightly greater than the difference between the forward turn-on voltage threshold (Vsd) and the reverse turn-on voltage threshold (Vsi) of the reading diode.

6. A matrix according to claim 1, wherein the reverse turn-on voltage threshold of the reading diode is lower than the steady reference voltage.

7. A matrix according to claim 1, werein the reverse turn-on voltage threshold of the reading diode is greater than the steady reference voltage.

8. A matrix according to claim 1, wherein the reading diode is made in the form of an NIPIN or a PINIP type, open base transistor, namely a structure with two electrodes and five superimposed, semiconducting layers which are, respectively, an N type (or conversely P type) doped layer, a relatively thick intrinsic layer, a very thin P type (or conversely N type layer), a very thin intrinsic layer and, finally, a N type (or conversely P type) doped layer.

9. A matrix according to claim 1 comprising, with a view to an application in radiology, a scintillator to convert an X-radiation (or gamma, neutron or other radiation) into light radiation in the band of wavelengths to which the photosensitive dots are sensitive.

10. A matrix according to claim 1, wherein the photosensitive dots are formed by superimposition of layers amorphous silicon.

* * * * *